United States Patent
Wikström

(10) Patent No.: US 9,503,082 B2
(45) Date of Patent: Nov. 22, 2016

(54) CURRENT SWITCHING DEVICE WITH IGCT

(71) Applicant: ABB Technology AG, Zürich (CH)

(72) Inventor: Tobias Wikström, Egliswil (CH)

(73) Assignee: ABB Schweiz AG, Baden (CH)

(*) Notice: Subject to any disclaimer, the term of this patent is extended or adjusted under 35 U.S.C. 154(b) by 159 days.

(21) Appl. No.: 14/257,509

(22) Filed: Apr. 21, 2014

(65) Prior Publication Data

US 2014/0312959 A1    Oct. 23, 2014

(30) Foreign Application Priority Data

Apr. 19, 2013   (EP) .................................... 13164553

(51) Int. Cl.
  *H03K 17/72* (2006.01)
  *H03K 17/732* (2006.01)
  *H03K 17/0412* (2006.01)

(52) U.S. Cl.
  CPC ........ *H03K 17/732* (2013.01); *H03K 17/0412* (2013.01)

(58) Field of Classification Search
  USPC ....................................................... 327/438
  See application file for complete search history.

(56) References Cited

U.S. PATENT DOCUMENTS 6,426,666 B1 * 7/2002 Li ...................... H03K 17/0403
                                                              327/438
2002/0118503 A1   8/2002 Gruening et al.
2012/0037616 A1 * 2/2012 Kitahara ........... H02M 7/53871
                                                              219/665
2012/0075001 A1 * 3/2012 Sumitomo ....... H03K 19/01852
                                                              327/333

FOREIGN PATENT DOCUMENTS

EP    1 235 334 A2    8/2002
EP    1235334 A2      8/2002

OTHER PUBLICATIONS

European Search Report issued in corresponding European Patent Application No. 13164553.3 dated Jul. 16, 2013, 4 pages.
Search Report mailed on Jul. 16, 2013, by the European Patent Office for Application No. 13164553.3.

* cited by examiner

*Primary Examiner* — Lincoln Donovan
*Assistant Examiner* — Patrick Chen
(74) *Attorney, Agent, or Firm* — Taft Stettinius & Hollister LLP

(57) ABSTRACT

An exemplary current switching device includes an integrated gate-commutated thyristor with an anode, a cathode, and a gate, wherein a current between the anode and the cathode is interruptible by applying a switch-off voltage to the gate; and a gate unit for generating the switch-off voltage. The gate unit and a connection of the gate unit to the gate establish a gate circuit having a stray impedance. The gate unit is adapted for generating a spiked switch-off voltage with a maximum above a breakdown voltage ($VGR_{MAX}$) between the cathode and the gate, such that the switch-off voltage at the gate stays below the breakdown voltage ($VGR_{MAX}$) due to the stray impedance of the gate circuit.

15 Claims, 2 Drawing Sheets

US 9,503,082 B2

CURRENT SWITCHING DEVICE WITH IGCT

RELATED APPLICATION(S)

This application claims priority under 35 U.S.C. §119 to European Patent Application No. 13164553.3 filed in Europe on Apr. 19, 2013, the content of which is hereby incorporated by reference in its entirety.

FIELD

The disclosure relates to the field of high power electronics, and particularly to a current switching device, an inverter, and a method for switching an integrated gate-commutated thyristor (IGCT).

BACKGROUND INFORMATION

IGCTs are semiconductor switching devices that, for example, are used in inverters and other high power electronics devices due to their fast switching behaviour and their low switching losses. An IGCT in the conducting state may be switched off by applying a voltage to the gate of the IGCT. After that, a current between the anode and the cathode is blocked, and the IGCT remains in the blocked state until a negative voltage is applied to the gate again.

Usually, a gate unit is used to control the switching and for example to control the gate voltage of the IGCT. In a known gate unit, the available gate voltage is limited by the gate-commuted thyristor (GCT) technology, for example by the avalanche or breakdown voltage of the diode between the gate and the cathode. For example, the breakdown voltage may be about 24 V and the gate unit may apply a constant voltage of 20 V during switch-off.

In order to improve turn-off switching, during static conditions, one could increase the voltage generated by the gate unit and the breakdown voltage between the gate and the cathode. If in this case, the breakdown voltage is not increased, the gate could be driven into constant avalanche. Increasing the breakdown voltage can be, albeit possible, a monumental change in IGCT technology.

Alternatively, the impedance of the gate circuit may be decreased, which is also possible, but may be subjected to practical limits such as the lateral extension of the silicon wafer, the insulation specifications, cost, etc.

SUMMARY

An exemplary current switching device is disclosed, comprising: an integrated gate-commutated thyristor with an anode, a cathode, and a gate, wherein a current between the anode and the cathode is interruptible by applying a switch-off voltage to the gate; and a gate unit for generating the switch-off voltage, wherein a connection of the gate unit to the gate establishes a gate circuit having a stray impedance, wherein the gate unit is configured for generating a spiked switch-off voltage with a maximum voltage above a breakdown voltage ($VGR_{MAX}$) between the cathode and the gate, such that the switch-off voltage at the gate stays below the breakdown voltage ($VGR_{MAX}$) due to the stray impedance of the gate circuit.

An exemplary method for switching an integrated gate-commuted thyristor is disclosed, the method comprising: receiving a switch-off signal for the thyristor in a gate unit; generating a spiked switch-off voltage, wherein the spiked switch-off voltage has a maximum voltage above a breakdown voltage ($VGR_{MAX}$) between a cathode and a gate of the thyristor; and applying the spiked switch-off voltage via a gate circuit to the gate of the thyristor, such that the switch-off voltage at the gate stays below the breakdown voltage ($VGR_{MAX}$) due to a stray impedance of the gate circuit.

BRIEF DESCRIPTION OF THE DRAWINGS

The subject-matter of the disclosure will be explained in more detail in the following text with reference to exemplary embodiments which are illustrated in the attached drawings.

In principle, identical parts are provided with the same reference symbols in the figures.

DETAILED DESCRIPTION

Figure 1:
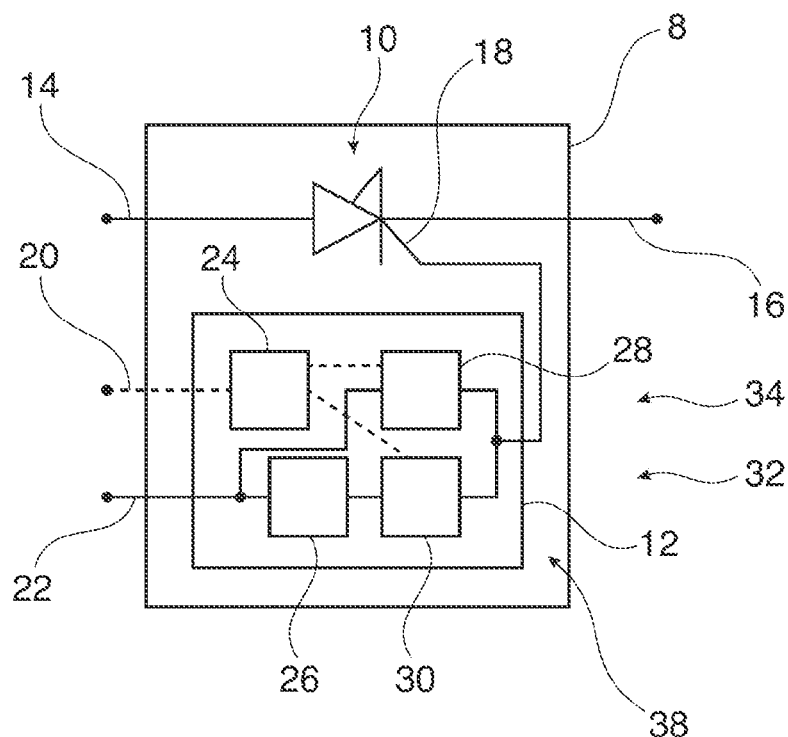
FIG. 1 schematically shows a first current switching device according to an exemplary embodiment of the disclosure.

Exemplary embodiments of the present disclosure provide a reliable and fast capability of switching an IGCT, without modifying the IGCT itself.

According to an exemplary embodiment of the present disclosure, a current switching device may be seen as a module including an IGCT and its control, a gate unit. The current switching device and for example the IGCT may be adapted for switching high currents, e.g., current above 100 A or even above 1,000 A and/or medium voltages above 1,000 V or 5,000 V.

According to an exemplary embodiment of the present disclosure, the current switching device includes an IGCT with an anode, a cathode and a gate, wherein a current between the anode and the cathode is interruptible by applying a switch-off voltage to the gate; and a gate unit for generating the switch-off voltage, the gate unit and a connection of the gate unit to the gate establishing a gate circuit having a stray impedance. The gate unit is adapted for generating a spiked switch-off voltage with a maximum above a breakdown voltage between the cathode and the gate, such that the switch-off voltage at the gate stays below the breakdown voltage due to the stray impedance of the gate circuit.

The IGCT has a diode between the gate and the cathode has a breakdown or avalanche voltage that should not be exceeded to operate the IGCT in a reliable manner. However, the gate circuit connected to the gate (which may include an electrical connection between the gate unit and a gate contact and all or part of the circuitry of the gate unit) has an impedance that may be considered, when applying a non-constant switch-off voltage to the gate.

The gate unit may generate a spiked (e.g., non-constant and/or variable) switch-off voltage, which is transformed by the gate circuit to a switch-off voltage at the gate that stays below the breakdown voltage of the diode between the gate and the cathode.

The control of the IGCT at switch-off may be seen as the competition between the available gate voltage on the one hand, and the impedance of the gate-circuit on the other hand. This competition provides a commutation (e.g., the switching) of the anode current magnitude to the gate (from the cathode) before the anode voltage starts to rise. The available time for this commutation is on the order of one microsecond. Due to the spiked switch-off voltage generated by the gate unit, a switch-off voltage as high as possible and an associated gate current is applied to the gate.

In an exemplary embodiment of the present disclosure, the voltage applied (or generated) by the gate unit may be called VGU and the breakdown voltage may be called VGR. The voltage maximally permissible with regard to a variation of the breakdown voltage VGR may be called $VGR_{MAX}$, which for example may be 20.5 V, and may contain a regulation inaccuracy, $\Delta_{VGU}$, of 0.5 V.

The gate circuit, which may include an inductive voltage divider between the gate unit voltage source and the gate contact, facilitates the application of a much higher VGU during times of a change of the gate current, according to the following equation:

$$VGU_{MAX} = VGR_{MAX} + L_o \dot{I}_G + R_o I_G,$$

where $L_o$ and $R_o$ are the stray impedances of the gate circuit, $VGU_{MAX}$ is the maximal permissible voltage generated by the gate unit, and $I_G$ is the gate current. Knowing these parameters and with knowledge of the gate current and its rate of rise, one can actually apply a much higher voltage than the breakdown voltage VGR. For example, disregarding the ohmic part of the impedance and assuming a reasonable gate-circuit impedance ($L_o$) of 3 nH, and a gate rate of gate-current rise of 50 kA/us, the permissible overvoltage may be $3 \cdot 10^{-9}$ H$\times 50 \cdot 10^9$ A/s, or 150 V.

Thus, it is possible to model the switch-off voltage generated by the gate unit like a spike, e.g., with a maximum between two slopes with rising and falling voltage. It is possible that the switch-off voltage has only one spike or has more than one spike.

According to an exemplary embodiment of the present disclosure, the maximum of the spiked switch-off voltage is at least twice the breakdown voltage, for example at least 10-times the breakdown, for example more than 50 V or more than 500 V. The maximum may depend on the gate current according to the above equation.

From the above formula one can also derive that as higher the change of the switch-off current $dI_G/dt$, the higher the switch-off voltage generated by the gate unit may be. This may shorten the width of the spiked switch-off voltage.

According to another exemplary embodiment of the present disclosure, a spike width of the spiked switch-off voltage is smaller than 30 microseconds, for example 20 microseconds or 10 microseconds. Exemplarily, the spike width is at least 1 μs.

The gate unit can generate a predefined switch-off voltage (with a fixed pattern) and/or that the gate unit provides a loop-controlled switch-off voltage (with a variable pattern) based on a measurement of the gate current.

According to yet another exemplary embodiment of the disclosure, the gate unit includes a voltage generator for generating the spiked switch-off voltage with a fixed pattern. For example, from the known stray impedance of the gate circuit and an estimated current development, a fixed pattern for the switch-off voltage may be modeled. This fixed pattern may always be provided by the gate unit, when the IGCT has to be switched off.

According to an exemplary embodiment disclosed herein, the current switching device can include a gate current sensor for measuring a gate current (and for example the switch-off current) at the gate of the thyristor, wherein gate unit includes a voltage regulator for regulating the spiked switch-off voltage based on the measured gate current. For example, the voltage regulator may know the impedance of the gate circuit and may determine the switch-off voltage based on above equation by evaluating the switch-off current during short-time steps.

According to still another exemplary embodiment, the voltage regulator can be adapted (e.g., configured) for regulating the spiked switch-off voltage based on the time dependency of the measured gate current.

The voltage regulator (for generating a variable pattern) and the voltage generator (for generating a fixed pattern) may be part of the circuitry of the gate unit. The voltage regulator and/or the voltage generator may be adapted for regulating a DC output voltage.

Therefore, it should be understood that the gate unit may be equipped with an "intelligent" voltage regulation and/or generation system that is adapted to feed a voltage in the rate of the rise of the gate current. The system may apply the maximal gate voltage possible, without driving the gate into avalanche, other than possibly for a very short time during switching.

According to an embodiment of the disclosure, the gate unit includes an internal voltage source for providing the spiked switch-off voltage, the voltage source being supplied by an input voltage of the gate unit that is lower than the maximum of the spiked switch-off voltage. In this way, an increase in the supply voltage of the gate unit can be avoided. The internal voltage source may be charged during times, when no high-switch-off voltage is specified. For example, the voltage source may include a capacitance to be charged in times between a generation of spiked switch-off voltages. The internal voltage source and for example the capacitance may provide a voltage above 100 V, 200 V, 500 V to the voltage generator and/or voltage regulator, which then forms the pattern of the applied switch-off voltage.

According to an exemplary embodiment of the present disclosure, the spiked switch-off voltage is generated in a first channel of the gate unit. The first channel may include the internal voltage source (with a capacitor or a capacitor bank charged much higher than the breakdown voltage) and/or the voltage generator and/or the voltage regulator.

The first channel may be seen as a turn-off channel, which may be responsible for applying the maximally permissible switch-off voltage at turn-off, when there is a steep change of the gate current ($dI_G/dt \gg 0$). The output voltage of the first channel may either be of fixed magnitude (e.g., may have a fixed pattern) and limited in time, or of regulated voltage (variable pattern and/or according to the above equation).

According to another exemplary embodiment of the present disclosure, the gate unit may include a second channel adapted for generating a constant switch-off voltage after the spiked switch-off voltage has been generated, the constant switch-off voltage being lower than the breakdown voltage between the cathode and the gate. The gate unit may have two off-channels and a gateway for switching between these, a first channel as a static source with a voltage less than the breakdown voltage, and a second channel as a dynamic source, regulated but with a maximum voltage higher than the breakdown voltage.

The second channel may be seen (e.g., used) as an off-channel, which may be responsible for protecting the device against involuntary triggering (dV/dt, etc.). The second channel may be connected to the gate with comparably relaxed impedance specifications. The voltage of the second channel is not necessarily related to the breakdown voltage, but may be considerably lower, for example 5 V.

The channels may be applied to the gate separated in time, according to the following scheme: The first channel may be applied whenever the output voltage of the first channel is higher than the output voltage of the second channel. Otherwise, the second channel may be applied.

One advantage of the configuration with the two channels may be that difficulties with lowering the gate circuit impedance may be circumvented, for example considering high turn-off currents applicable for IGCTs of ever increasing current ratings. A further advantage may be the reduced usage of a capacitance for the internal voltage source.

In accordance with another exemplary embodiment, the circuit can relate to a medium voltage inverter including a plurality of current switching devices, as described in the above and in the following. For example, two switching devices (together with an appropriate control) connected in series between a constant voltage source may be used for generating an alternating one-phase current at their interconnection.

In accordance with an exemplary embodiment of the disclosure, the circuit relates to a method for switching an IGCT. The method may be automatically performed by a gate unit for the IGCT. It has to be understood that features of the method as described in the above and in the following may be features of the current switching device as described in the above and in the following.

According to yet another exemplary embodiment of the disclosure, the method includes the steps of: receiving a switch-off signal for the thyristor in a gate unit; generating a spiked switch-off voltage, wherein the spiked switch-off voltage has a maximum above a breakdown voltage between a cathode and a gate of the thyristor; applying the spiked switch-off voltage via a gate circuit to the gate of the thyristor, such that the switch-off voltage at the gate stays below the breakdown voltage due to a stray impedance of the gate circuit.

In other words, the impedance of the gate circuit may be considered for setting the maximum of the switch-off voltage that is generated by the gate unit. In case the gate current changes fast, the generated switch-off voltage may be much higher than the breakdown voltage between the gate and the cathode.

According to an exemplary embodiment of the disclosure, the method includes a further the step of: generating the spiked switch-off voltage with a fixed pattern. As already explained, the gate unit may comprise a voltage generator that always generates the same spiked switch-off voltage, when the switch-off signal is received.

According to another exemplary embodiment of the disclosure, the method further includes the steps of: measuring a gate current at the gate of the thyristor; and regulating the spiked switch-off voltage based on the measured gate current. It is possible that the maximum and/or the pattern of the applied switch-off voltage is controlled based on the measured gate current.

According to yet another exemplary embodiment of the present disclosure, the method includes a further the step of: generating a constant switch-off voltage that is lower than the breakdown voltage of the diode between the cathode and the gate subsequent to the application of the spiked switch-off voltage. These two voltages may be generated by the above and below mentioned channels of the gate unit.

These and other aspects of the disclosure will be apparent from and elucidated with reference to the embodiments described hereinafter.

FIG. 1 schematically shows a first current switching device according to an exemplary embodiment of the disclosure. FIG. 1 shows a current switching device 8 with an IGCT 10 and a gate unit 12. The IGCT 10 has an anode 14 and a cathode 16, which provide the high power outputs of the current switching device 8. The IGCT 10 furthermore has a gate 18, which is used for switching the IGCT 10. When a negative switch-on voltage is applied to the gate 18, the IGCT 10 becomes conducting, and a current may flow between the anode 14 and the cathode 16. When a positive voltage switch-off is applied to the gate 18, the IGCT 10 blocks and a current flow between the anode 14 and the cathode 16 is interrupted.

To prevent avalanche of a diode between the gate 18 and the cathode 16, the switch-off voltage need not exceed a breakdown voltage that depends on the design of the IGCT 10. For example, the IGCT 10 may be adapted to switch currents up to 1,000 A, and in another exemplary embodiment 5,000 A, and the breakdown voltage may be about 24 V.

The voltage applied to the gate 18 is generated by a gate unit 12 that provides two low power inputs 20, 22 of the current switching device 8. At a signal input 20, the gate unit 12 may receive switch-on and switch-off signals that trigger the switching of the IGCT 10. Furthermore, the gate unit has a power input 22 that may be connected to a low voltage power source, which for example may provide a voltage in the magnitude of the breakdown voltage, for example 20 V.

The gate unit 12 includes a controller 24, an internal voltage source 26, a constant voltage generator 28, and a variable voltage generator 30. The controller 24 may receive switch-off and switch-on signals and may control the constant voltage generator 28 and the variable voltage generator 30 to generate the corresponding voltage that is applied to the gate 18.

The constant voltage generator 28 is adapted for generating a constant voltage (for example 5 V) to be applied to the gate 18, lower than the breakdown voltage between the gate 18 and the cathode 16. This constant voltage may be directly generated from the input voltage at the input 22, and may be used for preventing the IGCT 10 from unintentionally triggering.

The variable voltage generator 30 is adapted for generating a variable voltage to be applied to the gate 18 that may be higher than the breakdown voltage. The variable voltage is generated from the output voltage of the internal voltage source 26, which is adapted for transforming the voltage at the input 22 to a higher level. The internal voltage source 26 may include a capacitor bank that is charged with this voltage.

The internal voltage source 26 and the variable voltage generator 30 may be seen (e.g., used) as a first channel 32 of the gate unit 12, and the constant voltage generator 28 may be seen as a second channel 34 of the gate unit 12.

When triggered by the controller 24, the variable voltage generator 30 is adapted for generating a spiked switch-off voltage 40, which will be explained in more detail with respect to FIG. 3. The spiked switch-off voltage 40 has a fixed shape or pattern, e.g., may not depend on further parameters, like, for example, a gate current.

Figure 2:
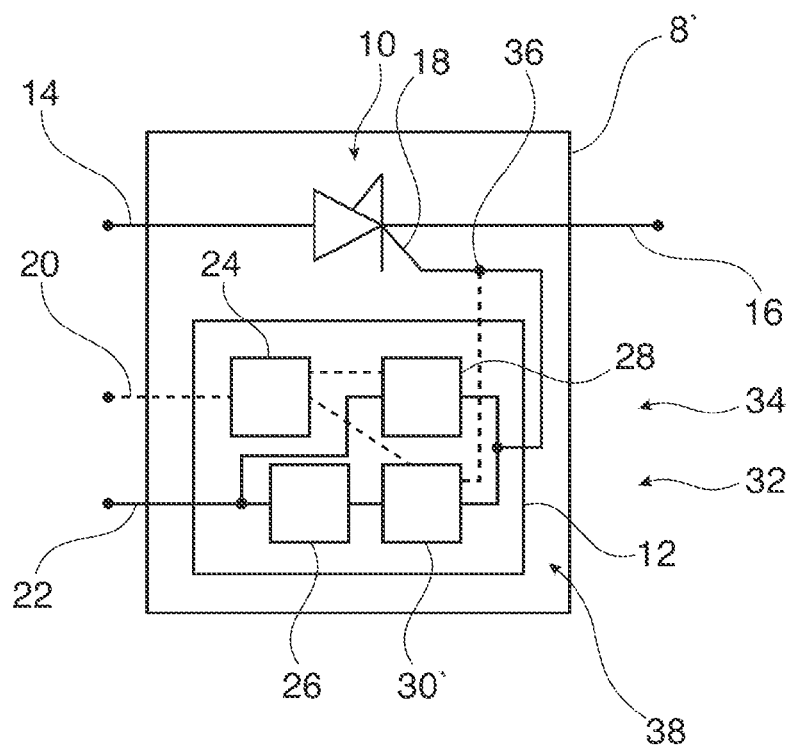
FIG. 2 schematically shows a second current switching device according to an exemplary embodiment of the disclosure.

FIG. 2 schematically shows a second current switching device according to an exemplary embodiment of the disclosure. FIG. 2 shows a current switching device 8 that instead of a variable voltage generator 30 has a variable voltage regulator 30'. The variable voltage regulator 30' receives a measurement signal from a current sensor 36 at the gate 18 and generates a spiked switch-off voltage 40 with a pattern that is based on the measured gate current.

Figure 3:
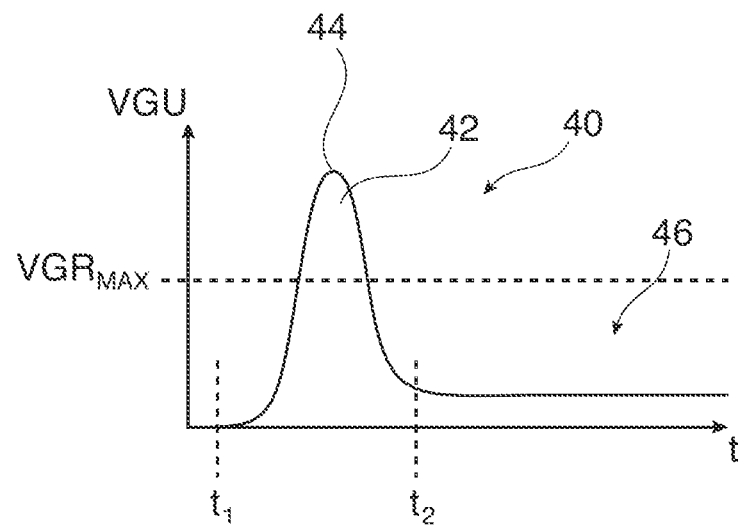
FIG. 3 shows a diagram with a spiked switch-off voltage according to an exemplary embodiment of the disclosure.

FIG. 3 shows a diagram with a spiked switch-off voltage according to an exemplary embodiment of the disclosure. FIG. 3 shows a diagram with a spiked switch-off voltage 40. A method for generating the spiked switch-off voltage 40 that may be performed by the gate unit 12 will be explained with respect to this diagram.

Before time $t_1$, the IGCT 10 is conducting and a current is flowing between the anode 14 and the cathode 16.

At time $t_1$, the controller 24 of the gate unit receives a switch-off signal and triggers the variable voltage generator 30 or the variable voltage regulator 30' to generate a spiked switch-off voltage, as indicated in FIG. 3.

Between times $t_1$ and $t_2$ (which corresponds to the spike width), a spiked variable voltage 40 is generated and applied to the gate 18 of the IGCT 10. The pattern or shape of the variable voltage 40 generated by the variable voltage generator 30 or the variable voltage regulator 30' is formed in such a way that due to the impedance of the gate circuit 38, e.g., the circuitry of the gate unit 12 and the gate 18, the voltage at the gate 18 does not exceed the breakdown voltage $VGR_{MAX}$. According to the equation mentioned above, the maximal permissible voltage $VGU_{MAX}$ for the switch-off voltage VGU depends on the stray impedance ($L_G$ and $R_G$) of the gate circuit 38, the gate current $I_G$, and the time derivate of the gate current $I_G$. Thus, when the gate current is high and/or is changing fast, the switch-off voltage VGU generated by the gate unit 12 may be (much) higher than the breakdown voltage $VGR_{MAX}$.

In FIG. 3, the spiked switch-off voltage 40 has a spike 42 with one maximum 44 higher than the breakdown voltage $VGR_{MAX}$. The switch-off voltage includes the spiked switch-off voltage 40 with its spike 42 and, exemplarily the constant switch-off voltage 46.

The maximum 44 and/or the shape or pattern of the spiked switch-off voltage 40 may be fixed every time a switch-off signal 20 is received. For example, the variable voltage generator 30 generates a spiked switch-off voltage 40 of a fixed pattern.

However, it is also possible that the maximum and/or the shape are adapted to the gate current. For example, the variable voltage regulator 30' generates a spiked switch-off voltage 40 of a variable pattern. For example, between times $t_1$ and $t_2$, the variable voltage regulator 30' may receive a measurement signal from the sensor 36 and may calculate the spiked switch-off voltage 40 based on the above equation. For example, the spiked switch-off voltage 40 may be calculated according to the above equation, e.g., the output voltage 40 may be set to a value as calculated from the right-hand-side of the above equation.

After time $t_2$, when the spiked switch-off voltage 40 generated by the first channel 32 has fallen below the voltage that is generated by the second channel 34, the voltage generation switches to the second channel 34. Thus, after time $t_2$, the voltage 46 applied to the gate 18 is generated by the constant voltage generator 28. With the voltage 46, which may be lower than breakdown voltage $VGR_{MAX}$, an unintentional switching of the IGCT 10 is prevented.

Figure 4:
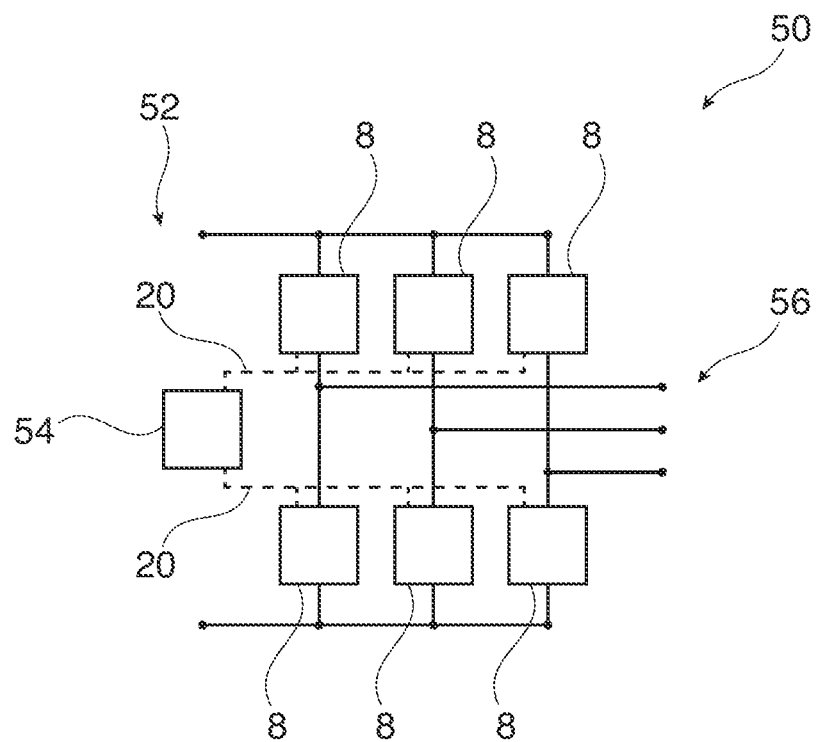
FIG. 4 shows an inverter according to an exemplary embodiment of the disclosure.

FIG. 4 shows an inverter according to an exemplary embodiment of the disclosure. FIG. 4 shows an inverter 50 including six current switching devices 8. Three pairs of current switching devices 8 are connected in parallel to a DC medium voltage source 52. By the control of a controller 54, which generates the switching signals 20 for the switching devices 8, each pair of current switching devices 8 generates an alternating one-phase output current 56. Thus, the inverter 50, for example, may generate a three-phase output current that may be applied to an electrical motor.

While the disclosure has been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those skilled in the art and practising the claimed disclosure, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A current switching device, comprising:
   an integrated gate-commutated thyristor with an anode, a cathode, and a gate, wherein a current between the anode and the cathode is interruptible by applying a switch-off voltage to the gate; and
   a gate unit for generating the switch-off voltage, wherein the gate unit and a connection to the gate establishes a gate circuit having a stray impedance,
   wherein the gate unit is configured for generating the switch-off voltage, which comprises a constant switch-off voltage and a spiked switch-off voltage, wherein the spiked switch-off voltage has a spike width smaller than 30 microseconds, with a maximum voltage above a breakdown voltage ($VGR_{MAX}$) between the cathode and the gate, such that the switch-off voltage at the gate stays below the breakdown voltage ($VGR_{MAX}$) due to the stray impedance of the gate circuit,
   wherein the spiked switch-off voltage is generated in a first channel of the gate unit,
   wherein the gate unit includes a second channel configured for generating a constant switch-off voltage after the spiked switch-off voltage has been generated, the constant switch-off voltage being lower than the breakdown voltage ($VGR_{Max}$) between the cathode and the gate.

2. The current switching device of claim 1, wherein the maximum voltage of the spiked switch-off voltage is at least twice the breakdown voltage ($VGR_{Max}$).

3. The current switching device of claim 1, wherein the gate unit includes a voltage generator for generating the spiked switch-off voltage with a fixed pattern.

4. The current switching device of claim 3, further comprising:
   a gate current sensor for measuring a gate current at the gate of the thyristor,
   wherein the gate unit includes a voltage regulator for regulating the spiked switch-off voltage based on the measured gate current.

5. The current switching device of claim 3, wherein the gate unit includes an internal voltage source for providing a voltage higher than the breakdown voltage ($VGR_{MAX}$), the internal voltage source being supplied by an input voltage of the gate unit that is lower than the maximum voltage of the spiked switch-off voltage.

6. The current switching device of claim 5, wherein the voltage source includes a capacitance to be charged in times between an output of spiked switch-off voltages.

7. The current switching device of claim 1, further comprising:
a gate current sensor for measuring a gate current at the gate of the thyristor,
wherein the gate unit includes a voltage regulator for regulating the spiked switch-off voltage based on the measured gate current.

8. The current switching device of claim 7, wherein the voltage regulator is configured for regulating the spiked switch-off voltage based on the time dependency of the measured gate current.

9. The current switching device of claim 1, wherein the gate unit includes an internal voltage source for providing a voltage higher than the breakdown voltage ($VGR_{MAX}$), the internal voltage source being supplied by an input voltage of the gate unit that is lower than the maximum voltage of the spiked switch-off voltage.

10. The current switching device of claim 9, wherein the voltage source includes a capacitance to be charged in times between an output of spiked switch-off voltages.

11. A medium voltage inverter comprising a plurality of current switching devices according to claim 1.

12. A method for switching an integrated gate-commuted thyristor, the method comprising:
receiving a switch-off signal for the thyristor in a gate unit;
generating a switch-off voltage, which comprises a constant switch-off voltage and a spiked switch-off voltage, wherein the spiked switch-off voltage has a maximum voltage above a breakdown voltage ($VGR_{MAX}$) between a cathode and a gate of the thyristor; and
applying the spiked switch-off voltage via a gate circuit to the gate of the thyristor, the gate circuit being established by the gate unit and a connection to the gate, such that the switch-off voltage at the gate stays below the breakdown voltage ($VGR_{MAX}$) due to a stray impedance of the gate circuit, and
generating a constant switch-off voltage that is lower than the breakdown voltage ($VGR_{MAX}$) between the cathode and the gate subsequent to the application of the spiked switch-off voltage.

13. The method of claim 12, further comprising:
generating the spiked switch-off voltage with a fixed pattern.

14. The method of claim 12, further comprising:
measuring a gate current at the gate of the thyristor; and
regulating the spiked switch-off voltage based on the measured gate current.

15. The method of claim 14, further comprising:
generating a constant switch-off voltage that is lower than the breakdown voltage ($VGR_{MAX}$) between the cathode and the gate subsequent to the application of the spiked switch-off voltage.

* * * * *